United States Patent
Kim et al.

(10) Patent No.: US 9,935,268 B2
(45) Date of Patent: **\*Apr. 3, 2018**

(54) DEPOSITING METHOD OF DEPOSITION MATERIAL USING LASER BEAMS AS MASK

(71) Applicant: Samsung Display Co., Ltd., Yongin-si, Gyeonggi-do (KR)

(72) Inventors: Won Yong Kim, Yongin-si (KR); Jin Hong Jeun, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/270,762

(22) Filed: Sep. 20, 2016

(65) Prior Publication Data

US 2017/0012200 A1 Jan. 12, 2017

Related U.S. Application Data

(62) Division of application No. 13/918,553, filed on Jun. 14, 2013, now abandoned.

(30) Foreign Application Priority Data

Dec. 21, 2012 (KR) .......................... 10-2012-0151026

(51) Int. Cl.
*B05D 5/12* (2006.01)
*H01L 51/00* (2006.01)
(Continued)

(52) U.S. Cl.
CPC .............. *H01L 51/001* (2013.01); *B05D 1/60* (2013.01); *B05D 3/06* (2013.01); *C23C 14/04* (2013.01);
(Continued)

(58) Field of Classification Search
CPC ..... C23C 14/04; C23C 14/042; C23C 14/046; C23C 14/048; C23C 14/24–14/325;
(Continued)

(56) References Cited

U.S. PATENT DOCUMENTS 4,260,649 A * 4/1981 Dension .................... C23F 4/00
118/50.1
5,014,646 A 5/1991 Ito
(Continued)

FOREIGN PATENT DOCUMENTS

CN 1158911 9/1997
CN 101016618 8/2007
(Continued)

OTHER PUBLICATIONS

Webster's Ninth New Collegiate Dictionary; Merriam-Webster incorporated, publishers; Springfield, Massachusetts, USA; 1990 (no month); excerpt p. 730.*

(Continued)

*Primary Examiner* — Marianne L Padgett
(74) *Attorney, Agent, or Firm* — Knobbe Martens Olson & Bear LLP

(57) ABSTRACT

A deposition apparatus includes a vacuum chamber, a substrate disposed in the vacuum chamber, a deposition source disposed in the vacuum chamber and facing the substrate to provide a deposition material onto the substrate, a laser oscillator generating a first laser beam, and an optical unit connected to a first side of the vacuum chamber and splitting the first laser beam to generate a plurality of mask laser beams. The mask laser beams are irradiated into the vacuum chamber to be disposed between the substrate and the deposition source. The deposition material making contact (Continued)

with the mask laser beams is oxidized, and the deposition material passing through the mask laser beams is deposited on the substrate.

12 Claims, 6 Drawing Sheets

(51) Int. Cl.
    *C23C 14/04*     (2006.01)
    *C23C 14/24*     (2006.01)
    *B05D 1/00*     (2006.01)
    *B05D 3/06*     (2006.01)
    *H01L 51/56*     (2006.01)

(52) U.S. Cl.
    CPC .......... *C23C 14/042* (2013.01); *C23C 14/046* (2013.01); *C23C 14/048* (2013.01); *C23C 14/24* (2013.01); *H01L 51/0013* (2013.01); *H01L 51/56* (2013.01)

(58) Field of Classification Search
    CPC ......... C23C 14/54; C23C 14/548; B05D 1/60; B05D 3/06; B05D 3/061; H01L 51/001; H01L 51/0013; H01L 51/56
    USPC ...... 427/561, 566–567, 582–584, 68, 69, 70
    See application file for complete search history.

(56) References Cited

U.S. PATENT DOCUMENTS

| | | | |
|---|---|---|---|
| 5,849,371 A | 12/1998 | Beesley | |
| 6,265,033 B1 * | 7/2001 | Hilliard | C23C 14/354 427/561 |
| 7,291,365 B2 * | 11/2007 | Kay | H01L 51/0013 427/561 |
| 7,399,497 B2 * | 7/2008 | Imamura | B05B 17/0623 427/248.1 |
| 8,673,407 B2 * | 3/2014 | Bi | H01S 3/0632 427/561 |
| 9,515,296 B2 * | 12/2016 | Han | H01L 51/56 |
| 2004/0123804 A1 * | 7/2004 | Yamazaki | C23C 14/046 118/723 VE |
| 2005/0263074 A1 | 12/2005 | Masuda | |
| 2005/0264811 A1 * | 12/2005 | Bi | H01S 3/0632 356/338 |
| 2007/0190235 A1 | 8/2007 | Yamazaki et al. | |
| 2010/0068897 A1 | 3/2010 | Liu | |
| 2011/0089412 A1 * | 4/2011 | Fujimori | B41M 5/38214 257/40 |
| 2017/0104184 A1 * | 4/2017 | Han | H01L 51/56 |

FOREIGN PATENT DOCUMENTS

| | | |
|---|---|---|
| CN | 101859575 | 10/2010 |
| CN | 102081200 | 6/2011 |
| KR | 10-2006-0115070 | 11/2006 |
| KR | 10-2007-0081438 | 8/2007 |
| KR | 10-2012-0007854 | 1/2012 |
| KR | 10-2012-0081480 | 7/2012 |

OTHER PUBLICATIONS

Richard J Lewis, Sr., editor; Hawley's Condensed Chemical Dictionary, 12th edition; then Nostrand Reinhold company; New York; 1993 (no month); excerpt, p. 861.*
Examination Report dated Jan. 24, 2017 in corresponding Chinese Patent Application No. 201310486450.1.

* cited by examiner

DEPOSITING METHOD OF DEPOSITION MATERIAL USING LASER BEAMS AS MASK

CROSS-REFERENCE TO RELATED APPLICATIONS

This application is a divisional of U.S. patent application Ser. No. 13/918,553, filed Jun. 14, 2013, which claims priority under 35 U.S.C. § 119 of Korean Patent Application No. 10-2012-0151026, filed on Dec. 21, 2012, the contents of which are hereby incorporated by reference in their entireties.

BACKGROUND

Field

The present disclosure relates to a deposition apparatus.

Description of the Related Technology

In recent years, an organic light emitting display has been spotlighted as a next generation display device since it has superior brightness and viewing angle, and does not need to include a separate light source as does a liquid crystal display. Accordingly, the organic light emitting display has advantages of slimness and lightweightedness. In addition, the organic light emitting display has other properties, such as, for example fast response speed, low power consumption, high brightness, and the like.

In general, the organic light emitting display includes an organic light emitting device including an anode electrode, an organic light emitting layer, and a cathode electrode. Holes and electrons are injected into the organic emitting layer through the anode electrode and the cathode electrode, and are recombined in the organic light emitting layer to generate excitons (electron-hole pairs). The excitons emit energy, which is discharged when an excited state returns to a ground state, as light.

The anode and cathode electrodes are formed of a metal thin layer or a transparent conductive thin layer. The organic light emitting layer is formed of at least one organic thin layer. To form the organic thin layer and the metal thin layer on the organic light emitting display, a deposition apparatus is used. The deposition apparatus generally includes a crucible filled with a deposition material, a nozzle spraying the deposition material, a substrate on which the deposition material is disposed, and a mask having opening portions.

SUMMARY OF CERTAIN INVENTIVE ASPECTS

The present disclosure provides a deposition apparatus capable of depositing a deposition material on a substrate using a laser mask.

Embodiments of the inventive concept provide a deposition apparatus including a vacuum chamber, a substrate disposed in the vacuum chamber, a deposition source disposed in the vacuum chamber and facing the substrate to provide a deposition material onto the substrate, a laser oscillator generating a first laser beam, and an optical unit connected to a first side of the vacuum chamber and splitting the first laser beam to generate a plurality of mask laser beams. The mask laser beams are irradiated into the vacuum chamber to be disposed between the substrate and the deposition source, the deposition material making contact with the mask laser beams is oxidized, and the deposition material passing through the mask laser beams is deposited on the substrate.

The mask laser beams are disposed to be spaced apart from the substrate in a direction vertical to the substrate.

The mask laser beams are spaced apart from the substrate in the direction vertical to the substrate by a distance of about 0.1 mm to about 1.0.

The mask laser beams are arranged substantially in parallel to the substrate and spaced apart from each other at regular intervals.

The optical unit includes a beam expander configured to expand the first laser beam, a beam splitter configured to split the expanded first laser beam to generate a plurality of second laser beams, and a beam controller configured to control a width of a corresponding second laser beam of the second laser beams and a distance between the second laser beams to generate the mask laser beams.

The beam expander includes a concave lens configured to expand the first laser beam and a convex lens configured to provide the expanded first laser beam to the beam splitter.

The beam splitter includes a plurality of lens units configured to split the expanded first laser beam and generates the second laser beams The beam controller includes a plurality of collimating lens units respectively corresponding to the lens units, and each of the collimating lens units is configured to control the width of the corresponding second laser beam provided from a corresponding lens unit of the lens units and the distance between the second laser beams to generate the mask laser beams.

The deposition source includes a crucible configured to heat the deposition material filled therein to evaporate the deposition material and a plurality of nozzles configured to spray the evaporated deposition material onto the substrate.

The deposition apparatus further includes an optical cable to connect the laser oscillator to the optical unit and to provide the first laser beam to the optical unit and a light receiver disposed at a second side of the vacuum chamber, which is opposite to the first side, to receive the mask laser beams.

Embodiments of the inventive concept provide a method of depositing a deposition material onto a substrate, including: disposing the substrate in a vacuum chamber, generating a first laser beam, splitting the first laser beam to generate a plurality of mask laser beams, providing the deposition material, and irradiating the mask laser beams into the vacuum chamber onto the deposition material, such that the deposition material making contact with the mask laser beams is oxidized, and the deposition material passing through the mask laser beams is deposited on the substrate.

The mask laser beams may be disposed to be spaced apart from the substrate in a direction vertical to the substrate.

The mask laser beams may be spaced apart from the substrate in the direction vertical to the substrate by a distance of about 0.1 mm to about 1.0.

The mask laser beams may be arranged substantially in parallel to the substrate and spaced apart from each other at regular intervals.

Splitting the first laser beam may include: expanding the first laser beam, splitting the expanded first laser beam to generate a plurality of second laser beams, and controlling a width of a corresponding second laser beam of the second laser beams and a distance between the second laser beams to generate the mask laser beams.

Providing the deposition material may include: heating the deposition material to evaporate the deposition material, and spraying the evaporated deposition material onto the substrate According to the above, the deposition apparatus may deposit the deposition material onto the substrate using the laser mask.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION OF CERTAIN INVENTIVE EMBODIMENTS

Figure 1:
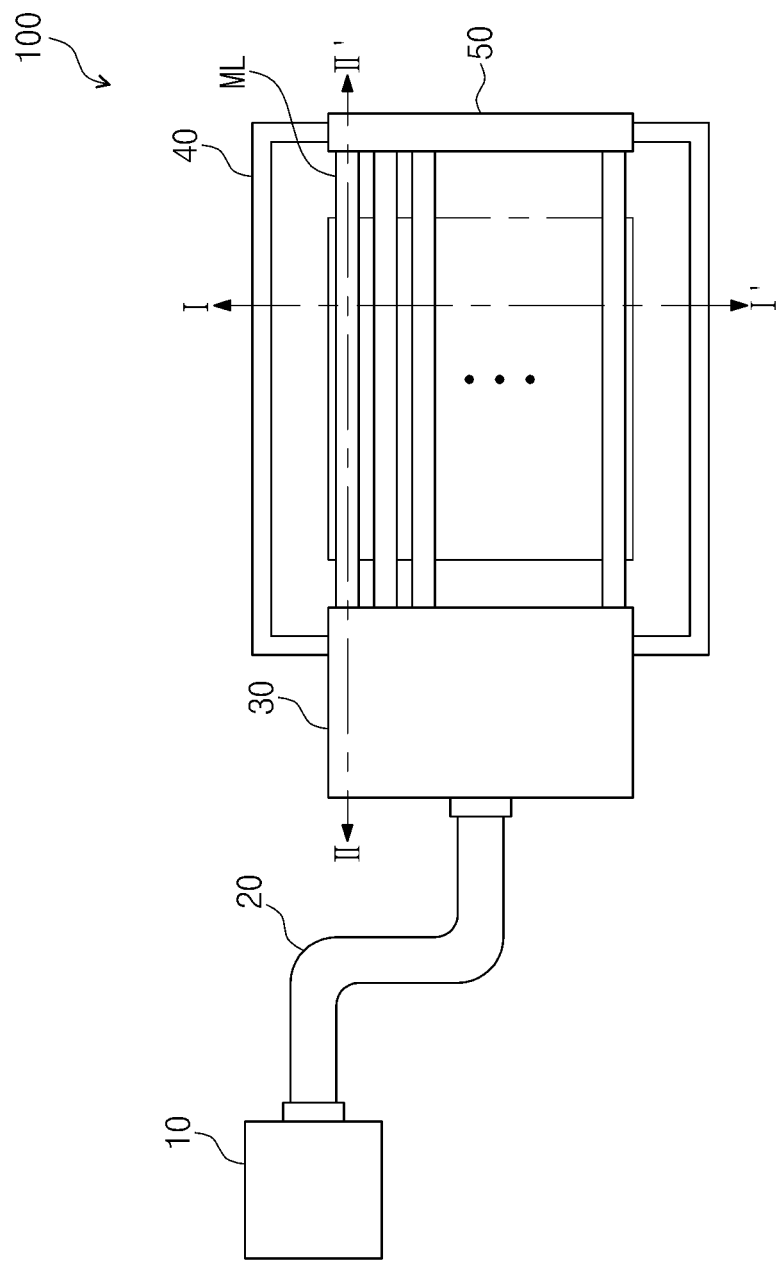
FIG. 1 is a plan view showing a deposition apparatus according to an embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers generally refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

When a crucible is heated at a predetermined temperature, the deposition material contained in the crucible is evaporated and the evaporated deposition material is sprayed through the nozzle. The deposition material sprayed from the nozzle is deposited on the substrate through the nozzle. As the mask, a fine metal mask is used. However, the fine metal mask is sagged when the fine metal mask is tensioned. Due to the sagging of the fine metal mask, the deposition material is deposited in an undesired area of the substrate, and thus a shadow phenomenon occurs. In addition, the fine metal mask is required to be aligned with the substrate before a deposition process is performed, but it is difficult to align the fine metal mask with the substrate.

FIG. 1 is a plan view showing a deposition apparatus according to an embodiment of the present disclosure.

Figure 3:
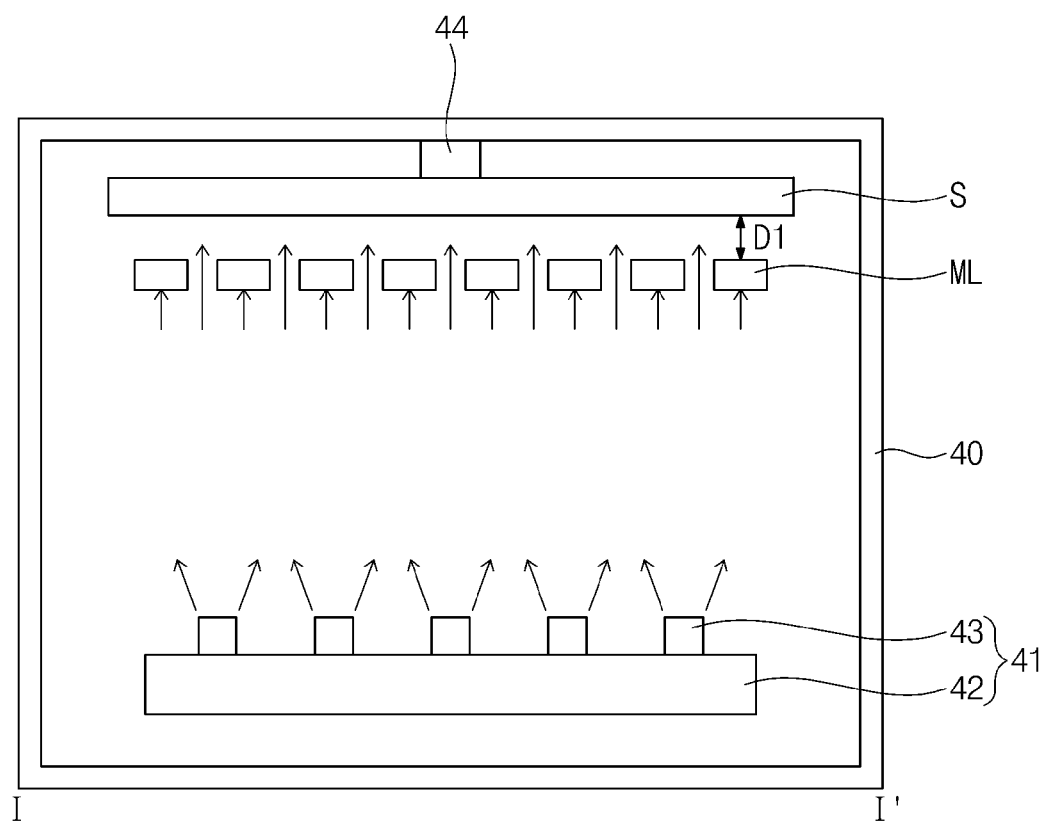
FIG. 3 is a cross-sectional view taken along a line I-I' shown in FIG. 1.
Figure 4:
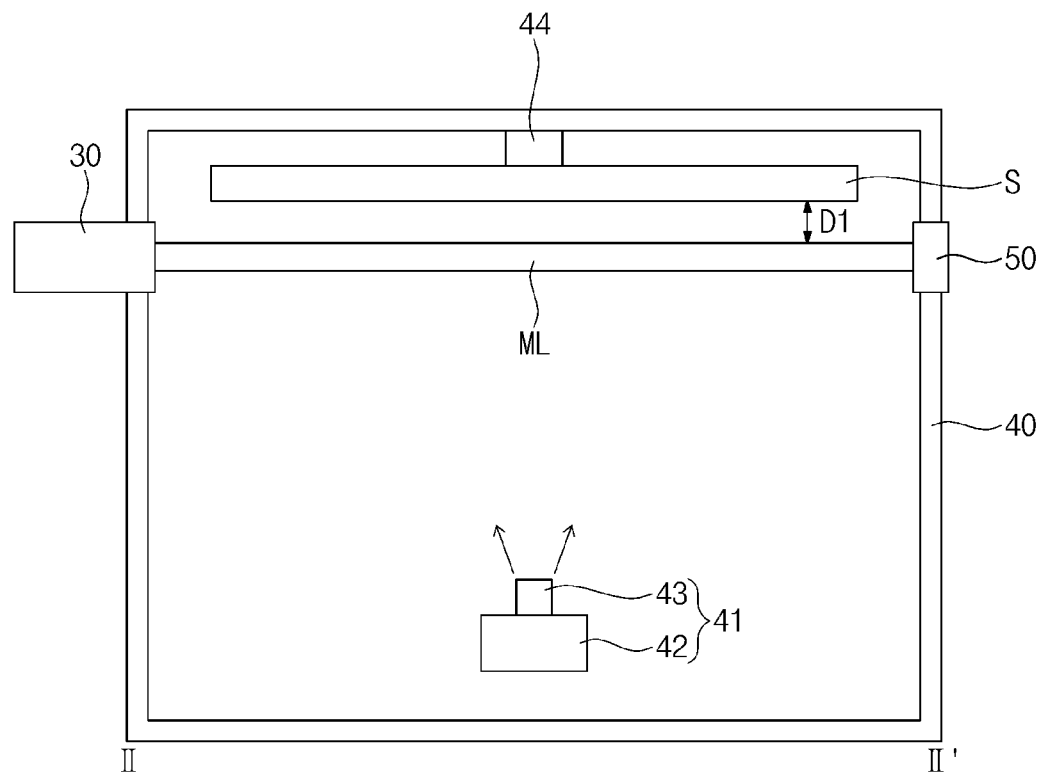
FIG. 4 is a cross-sectional view taken along a line II-II' shown in FIG. 1.

Referring to FIG. 1, a deposition apparatus 100 includes a laser oscillator 10, an optical cable 20, an optical unit 30, a vacuum chamber 40, a light receiver 50, a substrate S, and a deposition source 41 (refer to FIGS. 3 and 4).

The laser oscillator 10 generates a first laser beam. The first laser beam may be, but is not limited to, a linear laser beam. The first laser beam is provided to the optical cable 20.

The optical cable 20 is formed of an optical fiber. The optical cable 20 connects the laser oscillator 10 to the optical unit 30. The optical cable 20 provides a path through which the first laser beam generated by the laser oscillator 10 travels. That is, the optical cable 20 provides the first laser beam generated by the laser oscillator 10 to the optical unit 30.

The optical unit 30 is connected to a side of the vacuum chamber 40. The optical unit 30 receives the first laser beam generated by the laser oscillator 10 through the optical cable 20. The optical unit 30 divides the first laser beam to generate a plurality of mask laser beams ML. The optical unit 30 irradiates the mask laser beams ML into the vacuum chamber 40.

The light receiver 50 is disposed at the other side of the vacuum chamber 40. The light receiver 50 receives the mask laser beams ML.

The substrate S and the deposition source 41 are disposed in the vacuum chamber 40. The deposition source 41 faces the substrate S and sprays a deposition material to the substrate S. Detailed descriptions of the substrate S and the deposition source 41 are provided with reference to FIGS. 3 and 4 below.

The mask laser beams ML are irradiated into the vacuum chamber 40 to be disposed between the substrate S and the deposition source 41 in the vacuum chamber 40. The mask laser beams ML are spaced apart from each other at regular intervals, spaced apart from the substrate S by a first distance D1 in the direction vertical to the substrate S. The mask laser beams ML may be substantially in parallel to the substrate S.

The deposition source 41 sprays the deposition material onto the substrate S. The deposition material making contact with the mask laser beams ML is oxidized or carbonized. The deposition material passing through between the mask laser beams ML is deposited on the substrate S.

The deposition apparatus 100 performs the deposition process using a laser beam instead of a fine metal mask. Accordingly, defects caused by using the fine metal mask are prevented.

Figure 2:
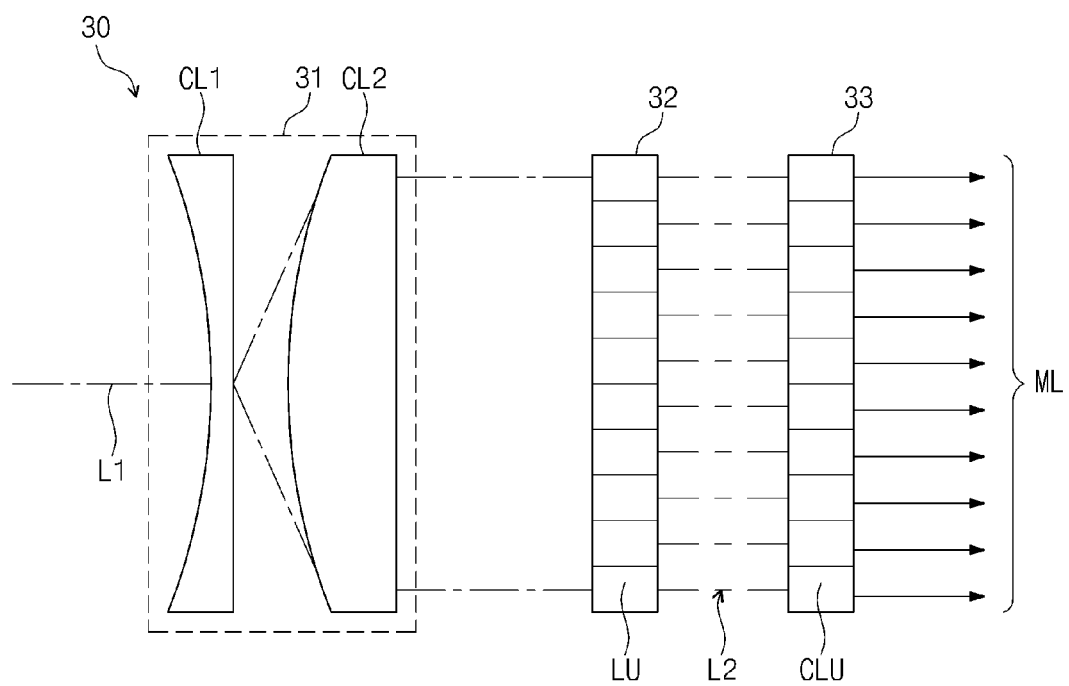
FIG. 2 is a view showing a configuration of an optical unit shown in FIG. 1.

FIG. 2 is a view showing a configuration of an optical unit shown in FIG. 1.

Referring to FIG. 2, the optical unit 30 includes a beam expander 31, a beam splitter 32, and a beam controller 33.

The beam expander 31 expands the first laser beam L1 provided through the optical cable 20. The expanded first laser beam L1 is provided to the beam splitter 32.

The beam splitter 32 splits the expanded first laser beam L1 to generate a plurality of second laser beams L2. The second laser beams L2 are applied to the beam controller 33.

The beam controller 33 controls a width of the second laser beams L2 and a distance between the second laser beams L2 to generate the mask laser beams ML. The mask laser beams ML are irradiated into the vacuum chamber 40 and provided to the light receiver 50.

The beam expander 31 includes a first lens CL1 and a second lens CL2. The first lens CL1 is a concave lens and the second lens CL2 is a convex lens. The first lens CL1 expands the first laser beam L1 provided from the optical cable 20, and the second lens CL2 provides the first laser beam L1 expanded by the first lens CL1 to the beam splitter 32.

The beam splitter 32 receives the expanded first laser beam L1 from the second lens CL2 of the beam expander 31. The beam splitter 32 includes a plurality of lens units LU. The lens units LU receive the first laser beam L1. The expanded first laser beam L1 may be split while passing through the lens units LU. That is, the expanded first laser beam L1 is split by the lens units LU and provided to the beam controller 33 as the second laser beams L2.

The beam controller 33 includes a plurality of collimating lens units CLU respectively corresponding to the lens units LU. Each collimating lens unit CLU receives a corresponding second laser beam of the second laser beams L2 from a corresponding lens unit of the lens units LU. The collimating lens unit CLU moves to left and right directions to control a focus of the corresponding second laser beam of the second laser beams. Accordingly, the width of the second laser beams L2 and the distance between the second laser beams L2 may be controlled by the collimating lens units CLU. The second laser beams L2, in which the width and the distance are controlled by the collimating lens units CLU, are irradiated into the vacuum chamber 40 as the mask laser beams ML.

FIG. 3 is a cross-sectional view taken along a line I-I' shown in FIG. 1 and FIG. 4 is a cross-sectional view taken along a line II-II' shown in FIG. 1.

Referring to FIGS. 3 and 4, the deposition source 41 and the substrate S are disposed in the vacuum chamber 40.

The vacuum chamber 40 maintains a high vacuum to prevent foreign substances from being infiltrated and secure straightness of the deposition material. The degree of the vacuum in the vacuum chamber 40 is under about 10E−7 Torr.

The deposition source 41 is disposed at a lower portion in the vacuum chamber 40. The deposition source 41 is filled with the deposition material, such as, for example, an organic material, which is deposited on the substrate S. The deposition source 41 is configured to evaporate the deposition material.

The deposition source 41 includes the crucible 42 filled with the deposition material and nozzles 43 that spray the deposition material evaporated by the crucible 42 to the substrate S.

The nozzles 43 are disposed on the crucible 42 and spaced apart from each other at regular intervals. As shown in FIG. 3, the nozzles 43 may be linearly arranged in left and right directions. Therefore, the deposition source 41 may be referred to as a linear deposition source. Although not shown in figures, each nozzle 43 is provided with a hole formed through a center portion thereof, through which the deposition material is sprayed. In addition, the deposition source 41 may further include a heater (not shown) disposed in the crucible 42 in order to evaporate the deposition material filled in the crucible 42.

The substrate S is disposed at an upper portion in the vacuum chamber 40 to face the nozzles 43. The substrate S is supported by a substrate support 44.

The substrate S is prone to be damaged by the mask laser beams ML. Thus, the mask laser beams ML are spaced apart from the substrate S such that the substrate S is not damaged by heat of the mask laser beams ML. That is, the mask laser beams ML are spaced apart from the substrate S by a first distance D1 in the direction vertical to the substrate S. As an example, the first distance D1 is in a range from about 0.1 mm to about 1.0 mm. Since the mask laser beams ML are irradiated by the optical unit 30, the first distance D1 between the substrate S and the mask laser beams ML is determined depending on the position at which the optical unit 30 is located. The mask laser beams ML are arranged substantially in parallel to the substrate S and spaced apart from each other at regular intervals.

The deposition material evaporated by the crucible 42 is sprayed onto the substrate S through the nozzles 43. The deposition material makes contact with the mask laser beams ML or passes through between the mask laser beams ML. The deposition material making contact with the mask laser beams ML may be oxidized or carbonized. The deposition material passing through between the mask laser beams ML may be deposited onto the substrate S.

Consequently, the deposition apparatus 100 may perform the deposition process using the laser beam instead of using the fine metal mask. Thus, defects caused by using the fine metal mask are prevented.

Figure 5:
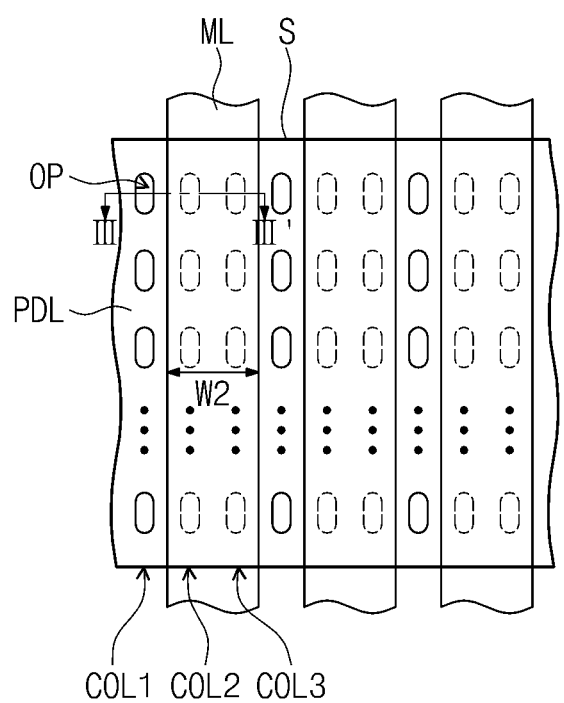
FIG. 5 is a view showing a process of forming an organic light emitting layer on a substrate using mask laser beams.
Figure 6:
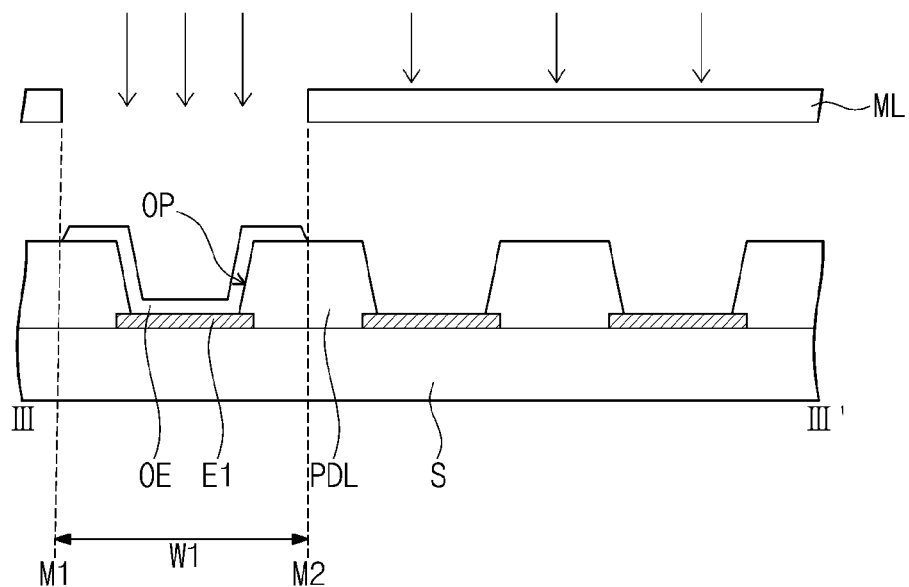
FIG. 6 is a cross-sectional view taken along a line III-III' shown in FIG. 5.

FIG. 5 is a view showing a process of forming an organic light emitting layer on a substrate using mask laser beams and FIG. 6 is a cross-sectional view taken along a line III-III' shown in FIG. 5.

Referring to FIGS. 5 and 6, a pixel defining layer PDL is disposed on the substrate S. The pixel defining layer PDL includes a plurality of first electrodes E1 and a plurality of opening portions OP respectively corresponding to the first electrodes E1. Each first electrode E1 is exposed through a corresponding opening portion of the opening portions OP of the pixel defined layer PDL. The pixel defined layer PDL covers a boundary of each first electrode E1.

The opening portions OP are located in areas in which rows cross columns. The columns include a first column COL1, a second column COL2, and a third column COL3, and the first, second, and third columns COL1, COL2, and COL3 are repeatedly arranged. An intermediate position between the opening portions OP arranged in the first column COL1 and the opening portions OP arranged in the third column COL3 adjacent to a left side of the first column COL1 may be referred to as a first intermediate position M1. An intermediate position between the opening portions OP arranged in the first column COL1 and the opening portions OP arranged in the second column COL2 adjacent to a right side of the first column COL1 may be referred to as a second intermediate position M2.

A first width W1 of the first column COL1 corresponds to a distance between the first intermediate position M1 and the second intermediate position M2. Each of the second and third columns COL2 and COL3 has the same width as the first width W1 of the first column COL1.

A width of each of the mask laser beams ML may have a second width W2 two times larger than the first width W1. A distance between the mask laser beams ML may be the same as the first width W1.

As shown in FIG. 5, the mask laser beams ML are arranged to expose the first column COL1 in the column direction. That is, the mask laser beams ML are arranged to expose the opening portions OP arranged in the first column COL1 in the column direction. In addition, the mask laser beams ML are arranged to cover the opening portions arranged in the second column COL2 and the third column COL3 adjacent to the second column COL2 in the column direction.

The deposition material sprayed from the deposition source 41 is provided onto the substrate S. As shown in FIG. 6, the deposition material making contact with the mask laser beams ML is oxidized or carbonized. Accordingly, the deposition material is not provided to the opening portions OP of the second column COL2 and the third column COL3 adjacent to the second column COL2. The deposition material passing through the mask laser beams ML is provided to the opening portions OP of the first column COL1, and thus the deposition material passing through between the mask laser beams ML is deposited on the pixel defining layer PDL of the first column COL1. Therefore, the deposition material may be deposited on the first electrode E1 exposed through the opening portions OP of the first column COL1. An organic light emitting layer OE is formed by using the deposition material.

Although not shown in figures, the mask laser beams ML are arranged to expose the second column COL2 in the column direction after the deposition material is provided to the opening portions OP of the first column COL1. That is, the mask laser beams ML are arranged to expose the opening portions OP arranged in the second column COL2 in the column direction. In addition, the mask laser beams ML are arranged to cover the third column COL3 and the first column COL1 adjacent to the third column COL3 in the column direction, so that the opening portions arranged in the third column COL3 and the first column COL1 are covered by the mask laser beams ML. In this case, the deposition material passing through between the mask laser beams ML is provided to the opening portions OP arranged in the second column COL2.

Although not shown in figures, the mask laser beams ML are arranged to expose the third column COL3 in the column direction after the deposition material is provided to the opening portions OP of the second column COL2. That is, the mask laser beams ML are arranged to expose the opening portions OP arranged in the third column COL3 in the column direction. In addition, the mask laser beams ML are arranged to cover the first column COL1 and the second column COL2 adjacent to the first column COL1 in the column direction, so that the opening portions arranged in the first column COL1 and the second column COL2 are covered by the mask laser beams ML. In this case, the deposition material passing through between the mask laser beams ML is provided to the opening portions OP arranged in the third column COL3.

Consequently, the deposition apparatus 100 may perform the deposition process using the laser beam instead of using the fine metal mask. Thus, defects caused by using the fine metal mask are prevented.

In addition, when the fine metal mask is used, the substrate and the fine metal mask are required to be precisely aligned with each other. In embodiments herein, however, the display apparatus 100 irradiates the laser beam to a predetermined direction, and the process of depositing the deposition material is easily performed.

Figure 7:
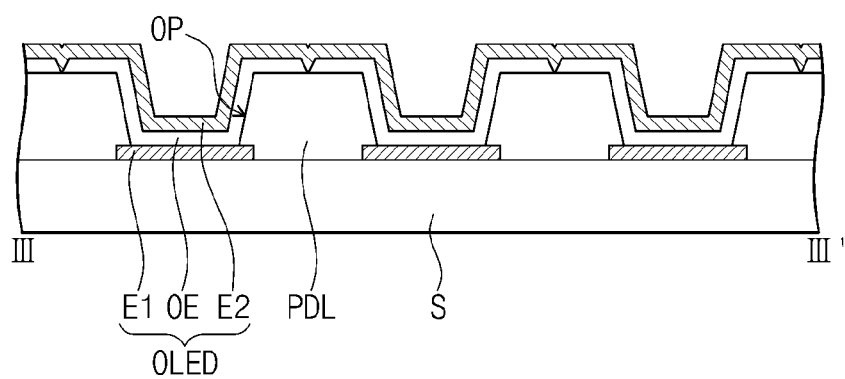
FIG. 7 is a cross-sectional view showing an organic light emitting device formed by using a deposition apparatus according to an embodiment of the present disclosure.

FIG. 7 is a cross-sectional view showing an organic light emitting device formed by using a deposition apparatus according to an embodiment of the present disclosure.

Referring to FIG. 7, the organic light emitting device OLED includes the first electrode E1, the second electrode E2, and the organic light emitting layer OE disposed between the first electrode E1 and the second electrode E2.

The organic light emitting layer OE may be formed by the above-mentioned mask laser beams ML. After the organic light emitting layer OE is formed by the mask laser beams ML, the second electrode E2 is formed to cover the pixel defining layer PDL and the organic light emitting layer OE.

The first electrode E1 may be a pixel electrode or an anode electrode, and the second electrode E2 may be a common electrode or a cathode electrode.

The first electrode E1 may be a transparent electrode or a reflective electrode. When the first electrode E1 is the transparent electrode, the first electrode E1 may include at least one of ITO, IZO, or ZnO. When the first electrode E1 is the reflective electrode, the first electrode E1 may include a reflection layer formed of at least one of Ag, Mg, Al, Pt, Pd, Au, Ni, Nd, Ir, Cr, or a compound thereof and a transparent conductive layer formed of ITO, IZO, or ZnO.

The second electrode E2 may be a transparent electrode or a reflective electrode. When the second electrode E2 is the transparent electrode, the second electrode E2 may include a layer formed by depositing at least one of Li, Ca, LiF/Ca, LiF/Al, Al, Mg, or a compound thereof to face the organic light emitting layer OE and an auxiliary electrode formed of a transparent conductive material, such as for example, ITO, IZO, or ZnO, on the layer. When the second electrode E2 is the reflective electrode, the second electrode E2 may be formed of at least one of Ag, Mg, Al, Pt, Pd, Au, Ni, Nd, Ir, Cr, L1, Ca, LiF/Ca, LiF/Al, or a compound thereof.

The organic light emitting layer OE is formed of a low molecular organic material or a high molecular organic material. The organic light emitting layer OE may have a multi-layer structure of a hole injection layer, a hole transport layer, an emission layer, an electron transport layer, and an electron injection layer. As an example, the hole injection layer is disposed on the first electrode E1 that is a positive electrode, and the hole transport layer, the emission layer, the electron transport layer, and the electron injection layer are sequentially stacked on the first electrode E1.

The first electrode E1 is a positive electrode to inject holes and the second electrode E2 is a negative electrode to inject electrons.

The organic light emitting device OLED emits light having one of red, green, blue, and white colors to display a predetermined image. To this end, the organic light emitting device OLED may include an organic material that emits the light corresponding to one of red, green, blue, and white colors.

A driving voltage is applied to the first electrode E1 to make the organic light emitting layer OE emit the light and a voltage having a polarity opposite to that of the driving voltage applied to the second electrode E2. Thus, holes and electrons injected into the organic emitting layer OE are recombined in the organic light emitting layer OE to generate excitons (electron-hole pairs). When an excited state of the excitons returns to a ground state, the organic light emitting layer OLED emits the light.

Although certain embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A method of depositing a deposition material onto a substrate, comprising:
    disposing the substrate in a vacuum chamber, the substrate including a plurality of opening portions arranged in columns;
    generating a first laser beam using a laser oscillator;
    splitting the first laser beam using an optical unit connected to the vacuum chamber to generate a plurality of mask laser beams;
    providing the deposition material from a deposition source to the substrate; and
    irradiating, from a first side of the vacuum chamber, the plurality of mask laser beams into the vacuum chamber onto the deposition material, wherein the plurality of mask laser beams are spaced apart from one another, wherein a space between pairs of mask laser beams corresponds with one of the plurality of opening portions on the substrate,
    wherein the deposition material makes contact with the mask laser beams and is oxidized such that the oxidized deposition material is not deposited on the substrate, and the deposition material passing through the space between a pair of the mask laser beams is deposited on the substrate,
    wherein the mask laser beams are used as a mask for performing the depositing of the deposition material.

2. The method of claim 1, wherein the mask laser beams are irradiated horizontally with respect to a surface of the substrate having the opening portions and are spaced apart from the substrate.

3. The method of claim 1, wherein each pair of the mask laser beams is spaced apart from the substrate by a distance of about 0.1 mm to about 1.0 mm.

4. The method of claim 1, wherein each pair of the mask laser beams is spaced apart from each other at a regular interval.

5. The method of claim 1, wherein the optical unit comprises:
    a beam expander configured to expand the first laser beam;
    a beam splitter configured to split the expanded first laser beam to generate a plurality of second laser beams; and
    a beam controller configured to control a width of each second laser beam of the second laser beams and a distance between said each beam of the second laser beams to generate the mask laser beams.

6. The method of claim 5, wherein the beam expander comprises:
    a concave lens configured to expand the first laser beam; and
    a convex lens configured to provide the expanded first laser beam to the beam splitter.

7. The method of claim 5, wherein the beam splitter comprises a plurality of first lens units configured to split the expanded first laser beam and generate the second laser beams.

8. The method of claim 7, wherein the beam controller comprises a plurality of collimating lens units respectively corresponding to the first lens units, and each of the collimating lens units is configured to control the width of said each second laser beam provided from a first lens unit of the first lens units and the distance between said each beam of the second laser beams to generate the mask laser beams.

9. The method of claim 1, wherein the deposition source comprises:
    a crucible configured to heat the deposition material filled therein to evaporate the deposition material; and
    a plurality of nozzles configured to spray the evaporated deposition material onto the substrate.

10. The method of claim 1, further comprising an optical cable to connect the laser oscillator to the optical unit and to provide the first laser beam to the optical unit.

11. The method of claim 1, further comprising a light receiver disposed at a second side of the vacuum chamber, which is opposite to the first side, to receive the mask laser beams.

12. The method of claim 1, wherein providing the deposition material comprises:
    heating the deposition material to evaporate the deposition material; and
    spraying the evaporated deposition material onto the substrate.

* * * * *